(12) United States Patent
Go et al.

(10) Patent No.: US 10,276,538 B2
(45) Date of Patent: Apr. 30, 2019

(54) ELECTRONIC DEVICE HAVING AN UNDER-FILL ELEMENT, A MOUNTING METHOD OF THE SAME, AND A METHOD OF MANUFACTURING A DISPLAY APPARATUS HAVING THE ELECTRONIC DEVICE

(71) Applicant: SAMSUNG DISPLAY CO., LTD., Yongin-si, Gyeonggi-Do (KR)

(72) Inventors: Jeonghun Go, Asan-si (KR); Jeong-Mo Nam, Incheon (KR); Sangrock Yoon, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/661,769

(22) Filed: Jul. 27, 2017

(65) Prior Publication Data

US 2018/0033765 A1 Feb. 1, 2018

(30) Foreign Application Priority Data

Aug. 1, 2016 (KR) .................. 10-2016-0098155

(51) Int. Cl.
*H01L 21/56* (2006.01)
*H01L 23/00* (2006.01)
(Continued)

(52) U.S. Cl.
CPC ............ *H01L 24/73* (2013.01); *H01L 21/563* (2013.01); *H01L 23/3142* (2013.01);
(Continued)

(58) Field of Classification Search
CPC ........ H01L 21/563; H01L 24/32; H01L 24/33
See application file for complete search history.

(56) References Cited

U.S. PATENT DOCUMENTS 5,203,076 A * 4/1993 Banerji ................. H01L 21/563
174/260
6,194,788 B1 * 2/2001 Gilleo ................... H01L 21/563
257/673

(Continued)

FOREIGN PATENT DOCUMENTS

KR 10-2008-0002501 1/2008
KR 10-2015-0135206 12/2015
(Continued)

*Primary Examiner* — David A Zarneke
(74) *Attorney, Agent, or Firm* — F. Chau & Associates, LLC

(57) ABSTRACT

A mounting method of an electronic device includes providing an electronic device which includes a semiconductor chip body including an upper surface, a lower surface opposite to the upper surface, and side surfaces connecting the upper surface and the lower surface, a plurality of bumps disposed on the lower surface, and an under-fill element disposed on at least one side surface. The method further includes mounting the electronic device on a printed circuit board including connecting pads formed thereon. The bumps of the semiconductor chip body are connected to the connecting pads. The method additionally includes heating the under-fill element to a predetermined temperature to form an under-fill layer between the lower surface of the semiconductor chip body and the printed circuit board.

14 Claims, 8 Drawing Sheets

(51) Int. Cl.
  *H01L 23/31* (2006.01)
  *H01L 23/498* (2006.01)

(52) U.S. Cl.
  CPC .............. *H01L 24/83* (2013.01); *H01L 24/92* (2013.01); *H01L 23/4985* (2013.01); *H01L 24/16* (2013.01); *H01L 24/32* (2013.01); *H01L 24/81* (2013.01); *H01L 2224/16225* (2013.01); *H01L 2224/16227* (2013.01); *H01L 2224/32058* (2013.01); *H01L 2224/32225* (2013.01); *H01L 2224/73204* (2013.01); *H01L 2224/81191* (2013.01); *H01L 2224/8288* (2013.01); *H01L 2224/832* (2013.01); *H01L 2224/8322* (2013.01); *H01L 2224/83191* (2013.01); *H01L 2224/83194* (2013.01); *H01L 2224/92125* (2013.01); *H01L 2924/00014* (2013.01); *H01L 2924/10156* (2013.01)

(56) References Cited

U.S. PATENT DOCUMENTS

| | | | | |
|---|---|---|---|---|
| 6,228,681 B1 * | 5/2001 | Gilleo | ............... | H01L 21/563 438/108 |
| 6,255,142 B1 * | 7/2001 | Babiarz | ............... | H01L 21/563 257/E21.503 |
| 6,265,776 B1 * | 7/2001 | Gilleo | ............... | H01L 21/563 228/180.22 |
| 6,297,560 B1 * | 10/2001 | Capote | ............... | B23K 35/025 257/701 |
| 6,978,540 B2 * | 12/2005 | Morganelli | ............ | H05K 3/305 29/825 |
| 7,047,633 B2 * | 5/2006 | Morganelli | ............ | H01L 21/563 174/259 |
| 7,265,994 B2 | 9/2007 | Danvir et al. | | |
| 8,796,075 B2 * | 8/2014 | Babiarz | ............... | H01L 21/563 257/778 |
| 9,321,245 B2 * | 4/2016 | Gaynes | ............... | B32B 9/00 |
| 9,374,902 B2 * | 6/2016 | Yim | ............... | H01L 21/563 |
| 2002/0162679 A1 * | 11/2002 | Hannan | ............... | H01L 21/563 174/528 |
| 2005/0139389 A1 * | 6/2005 | Yamamoto | ............ | H05K 3/305 174/260 |

FOREIGN PATENT DOCUMENTS

| KR | 10-2016-0006035 | 1/2016 |
|---|---|---|
| KR | 10-2017-0064594 | 6/2017 |

\* cited by examiner

ELECTRONIC DEVICE HAVING AN UNDER-FILL ELEMENT, A MOUNTING METHOD OF THE SAME, AND A METHOD OF MANUFACTURING A DISPLAY APPARATUS HAVING THE ELECTRONIC DEVICE

CROSS-REFERENCE TO RELATED APPLICATION

This application claims priority under 35 USC § 119 to Korean Patent Application No. 10-2016-0098155 filed on Aug. 1, 2016 in the Korean Intellectual Property Office, the disclosure of which is incorporated by reference herein in its entirety.

TECHNICAL FIELD

Exemplary embodiments of the present inventive concept relate to an electronic device, mounting method of the electronic device, and a method of manufacturing a display apparatus having the electronic device. More particularly, exemplary embodiments of the present inventive concept relate to an electronic device having an under-fill element, mounting method of the electronic device, and a method of manufacturing a display apparatus having the electronic device.

DISCUSSION OF THE RELATED ART

Various techniques for mounting electronic devices on printed circuit boards are under current development.

To secure the electronic device on the printed circuit board, an under-fill may fill any gap between the electronic device and the printed circuit board to provide cohesion between the electronic device and the printed circuit board.

SUMMARY

According to an exemplary embodiment of the present inventive concept, an electronic device includes a semiconductor chip body including an upper surface, a lower surface opposite to the upper surface, and side surfaces connecting the upper surface and the lower surface. The electronic device further includes a plurality of bumps disposed on the lower surface of the semiconductor chip body and an under-fill element disposed on at least one side surface.

According to an exemplary embodiment of the present inventive concept, a mounting method of an electronic device includes providing an electronic device which includes a semiconductor chip body including an upper surface, a lower surface opposite to the upper surface, and side surfaces connecting the upper surface and the lower surface, a plurality of bumps disposed on the lower surface, and an under-fill element disposed on at least one side surface. The method further includes mounting the electronic device on a printed circuit board including connecting pads formed thereon. The bumps of the semiconductor chip body are connected to the connecting pads. The method additionally includes heating the under-fill element to a predetermined temperature to form an under-fill layer between the lower surface of the semiconductor chip body and the printed circuit board.

According to an exemplary embodiment of the present inventive concept, a method of manufacturing a display apparatus includes providing an electronic device which includes a semiconductor chip body including an upper surface, a lower surface opposite to the upper surface, and side surfaces connecting the upper surface and the lower surface, a plurality of bumps disposed on the lower surface, and an under-fill element disposed on at least one side surface. The method further includes mounting the electronic device on a flexible substrate including a flexible material, and the flexible substrate is a base substrate of the display apparatus. Connecting pads are formed on the flexible substrate and are connected to the bumps of the semiconductor chip body. The method additionally includes heating the under-fill element to a predetermined temperature to form an under-fill layer between the lower surface of the semiconductor chip body and the flexible substrate.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Exemplary embodiments of the present inventive concept will be described in more detail below with reference to the accompanying drawings, in which exemplary embodiments of the preset inventive concept are shown.

Figure 1A:
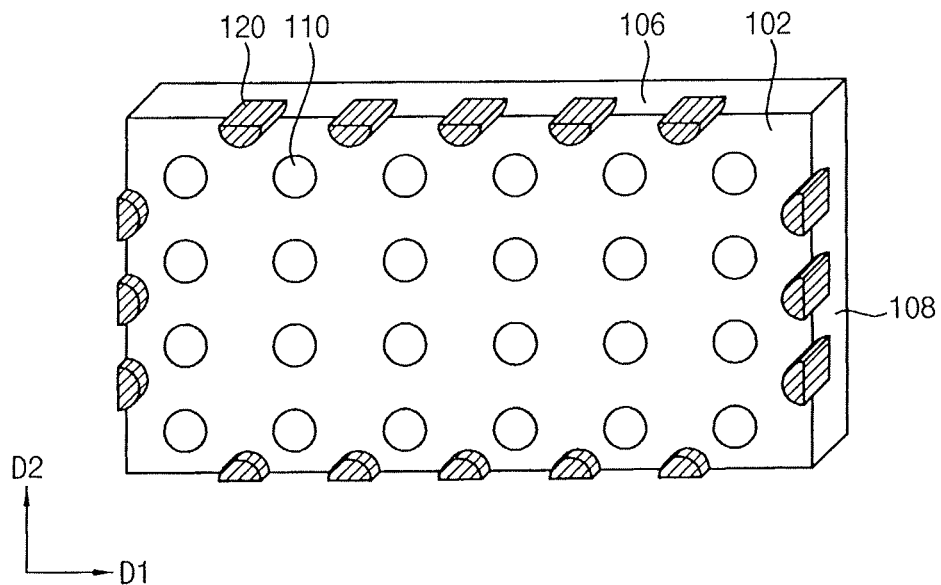
FIG. 1A is a perspective view illustrating an electronic device according to an exemplary embodiment of the present inventive concept.
Figure 1B:
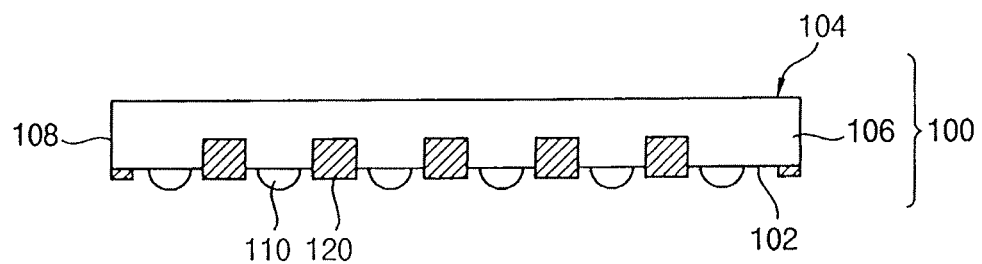
FIG. 1B is a side view illustrating the electronic device of FIG. 1A.

FIG. 1A is a perspective view illustrating an electronic device according to an exemplary embodiment of the present inventive concept. FIG. 1B is a side view illustrating the electronic device of FIG. 1A.

Figure 2A:
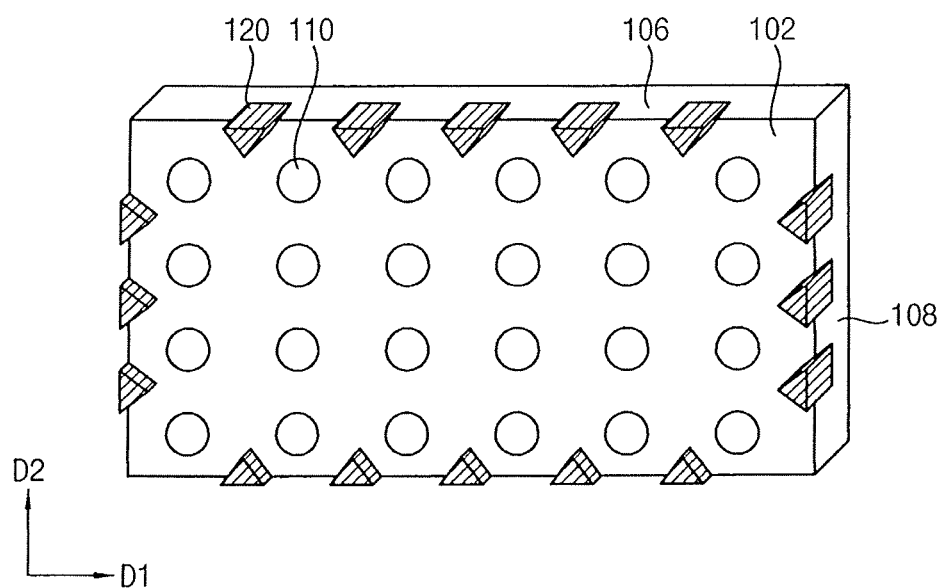
FIG. 2A is a perspective view illustrating an electronic device according to an exemplary embodiment of the present inventive concept.

Referring to FIGS. 1A and 2A, the electronic device may include a semiconductor chip body 100, a plurality of bumps 110 and an under-fill element 120.

The semiconductor chip body 100 may include a lower surface 102, an upper surface 104 (e.g., shown in FIG. 1B) opposite to the lower surface 102, a first side surface 106 connecting the upper surface 104 to the lower surface 102, a second side surface opposite to the first side surface 106, a third side surface 108, and a fourth side surface opposite to the third side surface 108. Thus, the first side surface 106 and the second side surface may extend in a first direction D1, and the third side surface 108 and the fourth side surface may extend in a second direction D2, which is substantially perpendicular to the first direction D1.

An integrated circuit (IC) chip may be embedded in the semiconductor chip body 100.

The bumps 110 may be formed on the lower surface 102 of the semiconductor chip body 100. The bumps 110 may be arranged to form a ball grid array (BGA).

A plurality of grooves may be formed on the first to fourth side surfaces 106 and 108. The under-fill element 120 may be disposed in each groove of the plurality of grooves. Each groove of the plurality of grooves may extend along the first side surface 106 and to the lower surface 102 of the semiconductor chip body 100, so that the under-fill element 120 in the groove may be exposed from the lower surface 102. For example, each groove of the plurality of grooves may have a radius of curvature that extends in the first direction D1.

Each of the grooves may have a semi-cylindrical shape which has a semicircle on the lower surface 102. The under-fill element 120 may have a semi-cylindrical shape, because the under-fill element 120 is received in the groove which has a semi-cylindrical shape. Accordingly, a shape of the under-fill element 120 may correspond to a shape of the groove when the under-fill element 120 is disposed in the groove. A portion of the under-fill element 120 may protrude from the lower surface 102 of the semiconductor chip body 100. The under-fill element 120 may be formed by filling the groove with an under-fill resin.

Referring again to FIG. 1B, in a side view of the electronic device, each groove may be disposed between two bumps 110 adjacent to each other. Further, the groove may extend toward the upper surface 104 of the semiconductor chip body such that the groove may reach, approximately, a middle region of the first to fourth side surfaces 106 and 108 that is between the upper surface 104 and the lower surface 102. Accordingly, the under-fill element 120 may extend toward the upper surface 104 such that the under-fill element may reach, approximately, the middle region of the first to fourth sides surfaces 106 and 108 when the under-fill layer (refers to FIG. 3C) is formed.

Figure 2B:
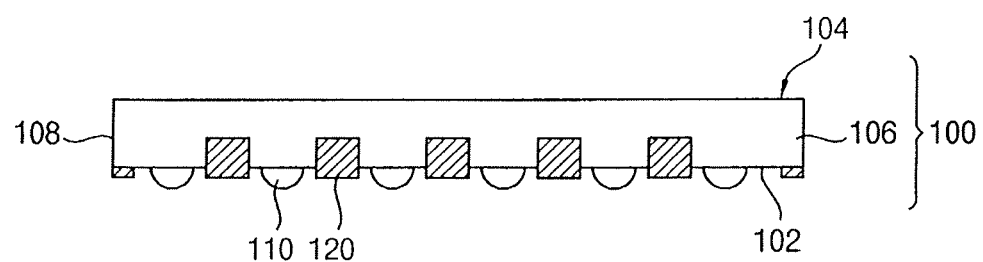
FIG. 2B is a side view illustrating the electronic device of FIG. 2A.

FIG. 2A is a perspective view illustrating an electronic device according to an exemplary embodiment of the present inventive concept. FIG. 2B is a side view illustrating the electronic device of FIG. 2A.

Referring to FIGS. 2A and 2B, the electronic device may be substantially a same as the electronic device of FIGS. 1A and 1B, except that an under-fill element 120 of the electronic device has a triangular prism shape. Thus, any further detailed descriptions concerning elements that may be assumed to be the same will be briefly described or omitted.

The electronic device may include a semiconductor chip body 100, a plurality of bumps 110 and an under-fill element 120. The semiconductor chip body 100 may include a lower surface 102, an upper surface 104, and first to fourth side surfaces 106 and 108.

A plurality of grooves may be formed on the first to fourth side surfaces 106 and 108. The under-fill element 120 may be disposed in each groove of the plurality of grooves. Each groove may extend along the first side surface 106 and may extend towards the lower surface 102, so that the under-fill element 120 in the groove may be exposed from the lower surface 102.

Each of the grooves may have a triangular prism shape which may have a triangular shape on the lower surface 102. The under-fill element 120 may have a triangular prism shape, because the under-fill element 120 is received in the groove which has a triangular prism shape.

Although the under-fill element 120 has the triangular prism shape in an exemplary embodiment of the present inventive concept, the under-fill element 120 may have various shapes. For example, the groove and the under-fill element 120 may have a quadrangular prism shape. Any structure is acceptable as long as the groove extends along the first, second, third or fourth side surfaces 106 or 108 and extends towards the lower surface 102 for exposing the under-fill element 120 from the lower surface 102. For example, a width of the triangular prism shaped groove (e.g., width of the base of the triangular prism shaped groove) may extend along the first, second, third or fourth side surfaces 106 or 108.

Figure 3A:
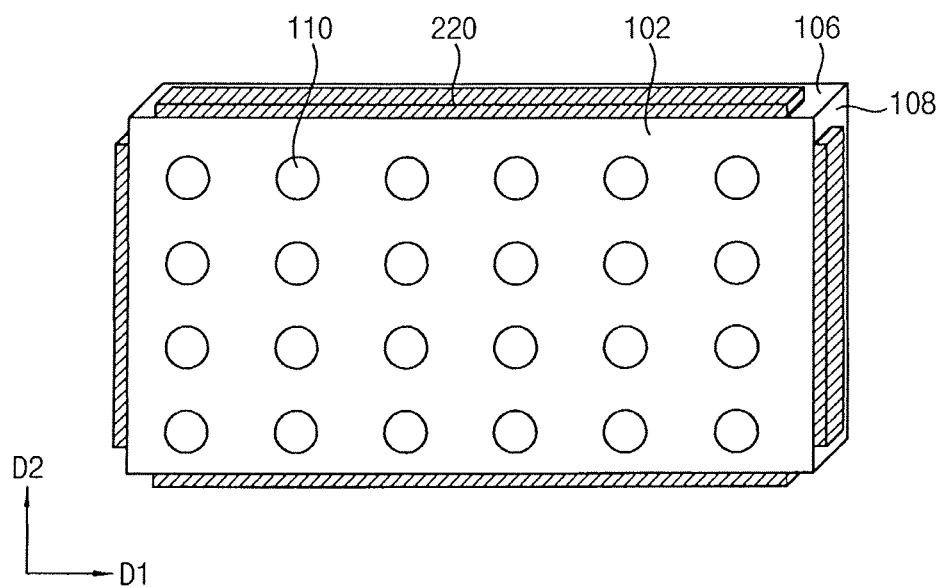
FIG. 3A is a perspective view illustrating an electronic device according to an exemplary embodiment of the present inventive concept.
Figure 3B:
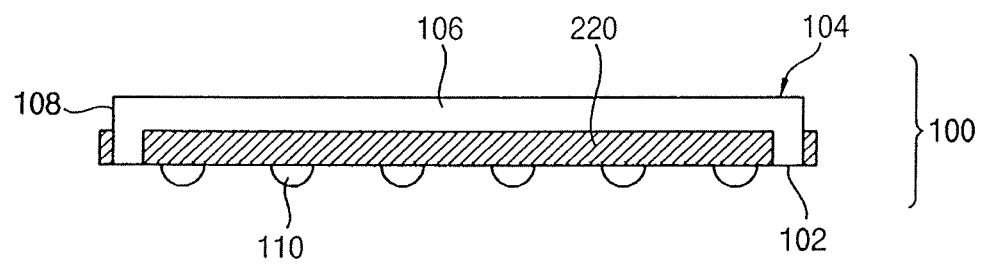
FIG. 3B is a side view illustrating the electronic device of FIG. 3A.

FIG. 3A is a perspective view illustrating an electronic device according to an exemplary embodiment of the present inventive concept. FIG. 3B is a side view illustrating the electronic device of FIG. 3A.

Referring to FIGS. 3A to 3B, the electronic device may be substantially a same as the electronic device of FIGS. 1A and 1B, except for an under-fill film 220. Thus, any further detailed descriptions concerning elements that may appear to be the same will be briefly described or omitted.

The electronic device may include a semiconductor chip body 100, a plurality of bumps 110 and an under-fill film 220. For example, the under-fill element 120 may be similar to the under-fill film 220. The semiconductor chip body 100 may include a lower surface 102, an upper surface 104, and first to fourth side surfaces 106 and 108.

The under-fill film 220 may be disposed on the first to fourth side surfaces 106 and 108. The under-fill film 220 may be formed by attaching a film, which includes an under-fill resin and has an adhesive property.

Figure 4A:
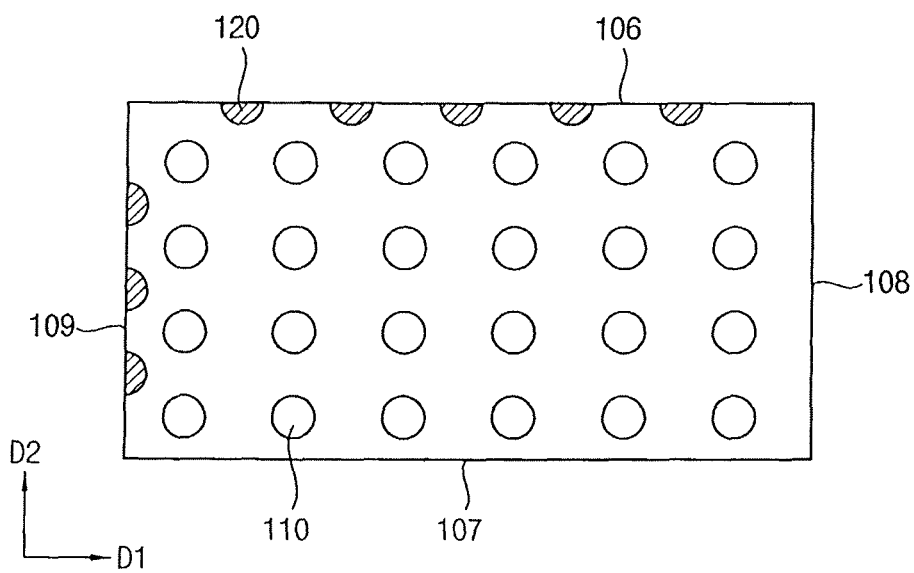
FIGS. 4A and 4B are perspective views illustrating electronic devices according to an exemplary embodiment of the present inventive.
Figure 4B:
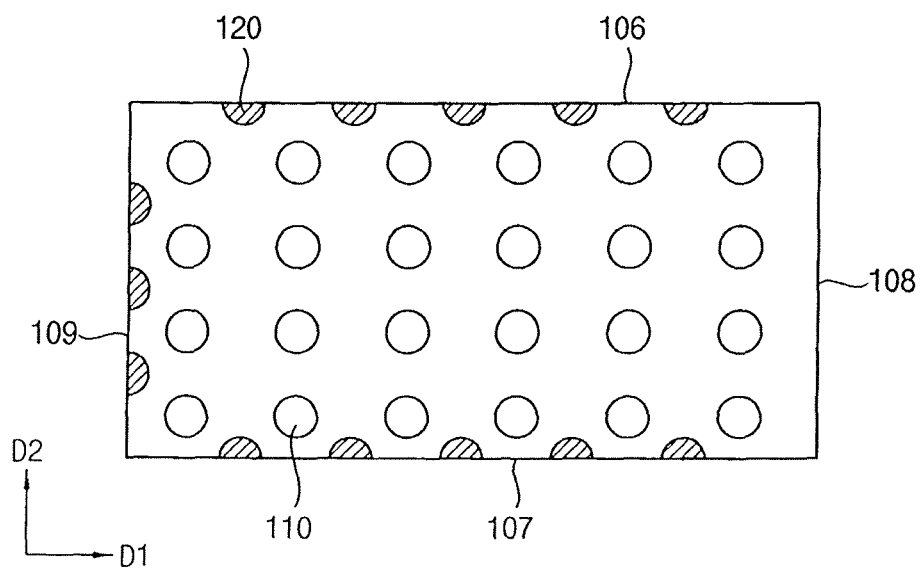

FIGS. 4A and 4B are perspective views illustrating electronic devices according to an exemplary embodiment of the present inventive.

Referring to FIG. 4A, the electronic device may be substantially same as the electronic device of FIGS. 1A and 1B, except that an under-fill element 120 and grooves formed on the side surfaces may be formed only on a first side surface 106 and a fourth side surface 109. However, exemplary embodiments of the present inventive concept are not limited thereto. For example, the under-fill element 120 and the grooves formed on the side surfaces may be formed only on a second side surface 107 and a third side surface 108. Thus, any further detailed descriptions concerning elements that may be assumed to the same may be omitted.

Referring to FIG. 4B, the electronic device may be substantially a same as the electronic device of FIGS. 1A and 1B, except that an under-fill element 120 and grooves formed on the side surfaces are formed only a first side surface 106, a second side surface 107 and a fourth side surface 109. However, exemplary embodiments of the present inventive concept are not limited thereto. For example, the under-fill element 120 and the grooves formed on the side surfaces may be formed only on a first side surface 106, a second side surface 107 and a third side surface 108. Thus, any further detailed descriptions concerning elements that may be assumed to be the same may be omitted.

Although the under-fill element 120 and the grooves each of which may have the semi-cylindrical shape formed only on the first side surface 106 and the fourth side surface 109 or only on the first side surface 106, the second side surface 107 and the fourth side surface 109 in an example embodiment of the present inventive concept, the under-fill element 120 may have various shapes and may be disposed on the semiconductor chip body 100.

Figure 5A:
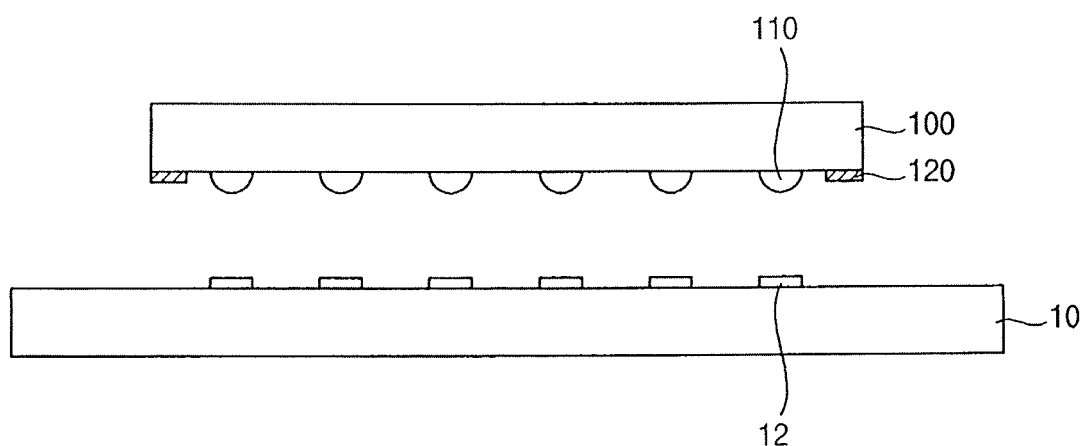
FIGS. 5A to 5C are cross-sectional views illustrating a mounting method of the electronic device of FIGS. 1A and 1B or FIGS. 2A and 2B.
Figure 5B:
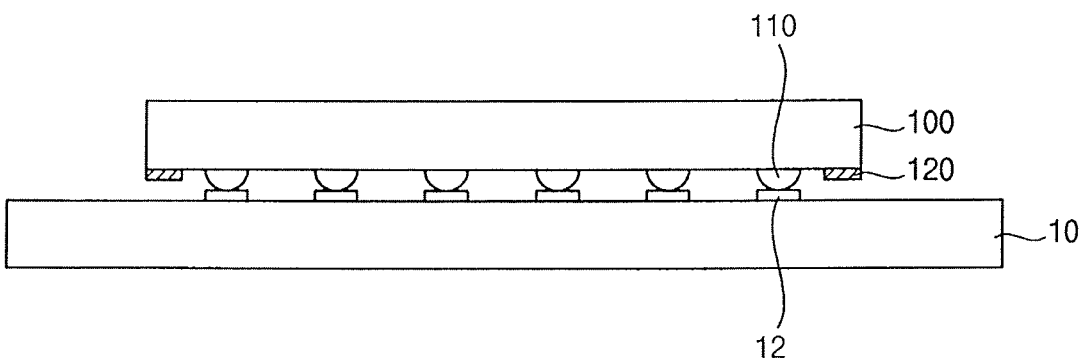
Figure 5C:
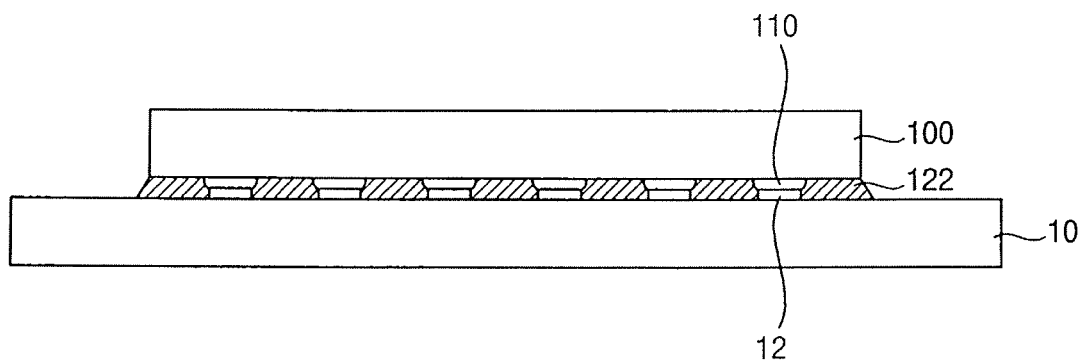

FIGS. 5A to 5C are cross-sectional views illustrating a mounting method of the electronic device of FIGS. 1A and 1B or FIGS. 2A and 2B.

Referring to FIG. 5A, a printed circuit board 10 and the electronic device may be provided. The electronic device may be the electronic device of FIGS. 1A and 1B or FIGS. 2A and 2B. The electronic device may include a semiconductor chip body 100, a plurality of bumps 110 and an under-fill element 120. The under-fill element 120 of the electronic device may be formed by filling the groove formed on a side surface of the semiconductor chip body 100 with an under-fill resin.

A plurality of connecting pads 12 may be formed on the printed circuit board 10. The connecting pads 12 may be formed to correspond to the bumps 110 of the electronic device.

Referring to FIG. 5B, the electronic device may be disposed on the printed circuit board 10. The electronic device may be aligned with the printed circuit board 10, so that each of the bumps 110 of the electronic device is corresponding to each of the connecting pads 12 of the printed circuit board 10.

Referring to FIG. 5C, by heating the under-fill element 120 while it is in a solid phase to a predetermined temperature, an under-fill layer 122 between the semiconductor chip body 100 and the printed circuit board 10 may be formed. When the under-fill element 120 is heated, its phase may change to a liquid phase, so that the under-fill layer 122 between the semiconductor chip body 100 and the printed circuit board 10 may be formed. For example, the under-fill element may be heated to its melting point temperature. A coating treatment may be performed on the upper surface of the printed circuit board 10. Thus, when the under-fill element 120 is changed to the liquid phase, the under-fill element 120 may move along the upper surface of the printed circuit board 10, which is coated with the treatment, to a central portion of the upper surface of semiconductor chip body 100. Accordingly, the under-fill layer 122 between the semiconductor chip body 100 and the printed circuit board 10 may be formed.

For example, the bump 110 may be partially melted and connected to the connecting pad 12.

Although the under-fill element 120 is heated to form the under-fill layer 122 in an exemplary embodiment of the present inventive concept, it is not limited thereto. For example, when the under-fill element 120 includes a material which may be melted by ultraviolet rays, the under-fill layer 122 may be formed by irradiating ultraviolet rays to the under-fill element 120.

According to the mounting method of the electronic device, the electronic device which has the under-fill element 120 in the groove at the side surface of the semiconductor chip body may be used. Thus, work efficiency of the mounting method may be improved.

In addition, the under-fill element 120 is formed on the electronic device before mounting the electronic device. Thus, even if there is limited space on the printed circuit board 10, the electronic device may be mounted on the printed circuit board efficiently.

Figure 6A:
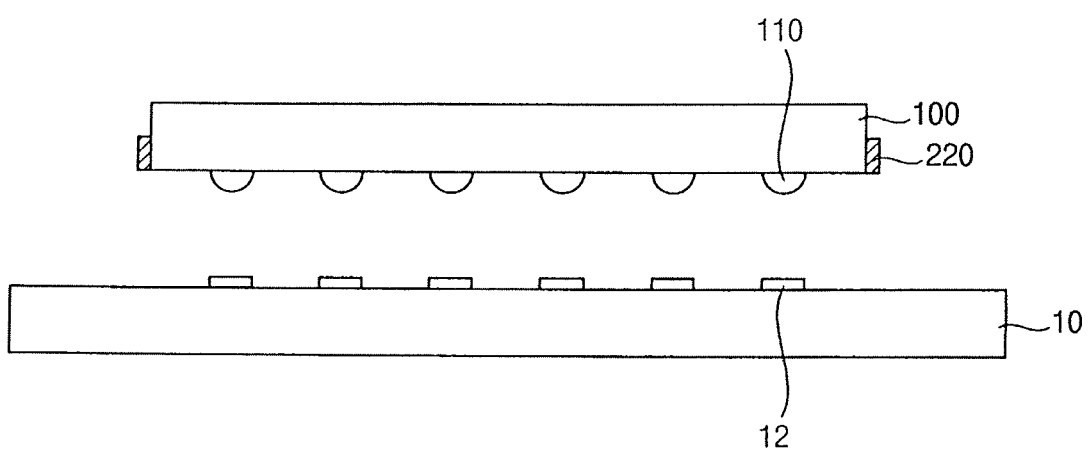
FIGS. 6A to 6C are cross-sectional views illustrating a mounting method of the electronic device of FIGS. 3A and 3B.
Figure 6B:
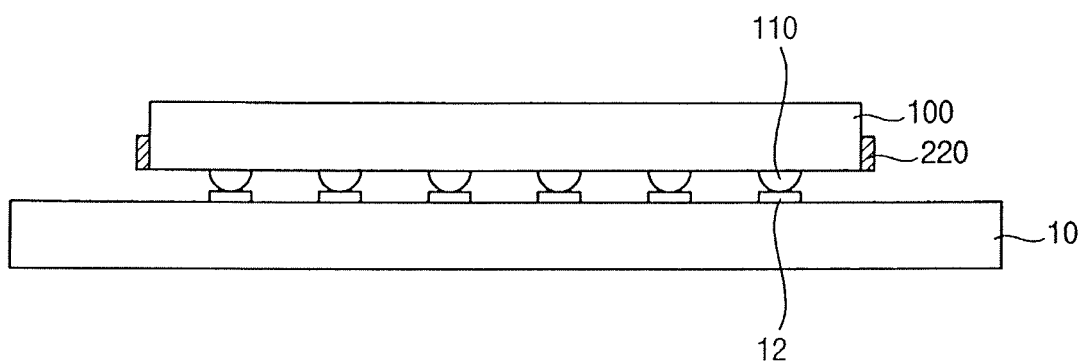
Figure 6C:
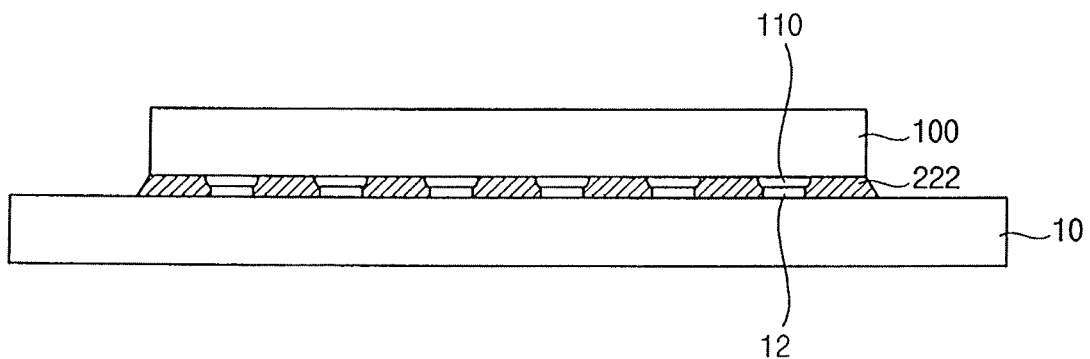

FIGS. 6A to 6C are cross-sectional views illustrating a mounting method of the electronic device of FIGS. 3A and 3B. The mounting method of the electronic device may be substantially a same as the mounting method of FIGS. 5A to 5C, except for attaching an under-fill film 220. Thus, any further detailed descriptions concerning elements that may be assumed to be the same may be briefly described or omitted.

Referring to FIG. 6A, a printed circuit board 10 and the electronic device may be provided. The electronic device may be the electronic device of FIGS. 3A to 3B. The electronic device may include a semiconductor chip body 100, a plurality of bumps 110 and an under-fill film 220. The under-fill film 220 of the electronic device may be formed by attaching a film including an under-fill resin and having adhesion onto the first to fourth side surfaces 106 and 108. A plurality of connecting pads 12 may be formed on the printed circuit board 10.

Referring to FIG. 6B, the electronic device may be disposed on the printed circuit board 10. In addition, the electronic device may be aligned with the printed circuit board 10.

Referring to FIG. 6C, by heating the under-fill film 220 to a predetermined temperature while in its solid phase, an under-fill layer 222 between the semiconductor chip body 100 and the printed circuit board 10 may be formed. For example, the under-fill film 220 may be heated to its melting point temperature. As an additional example, the bump 110 may be partially melted and connected to the connecting pad 12.

Figure 7A:
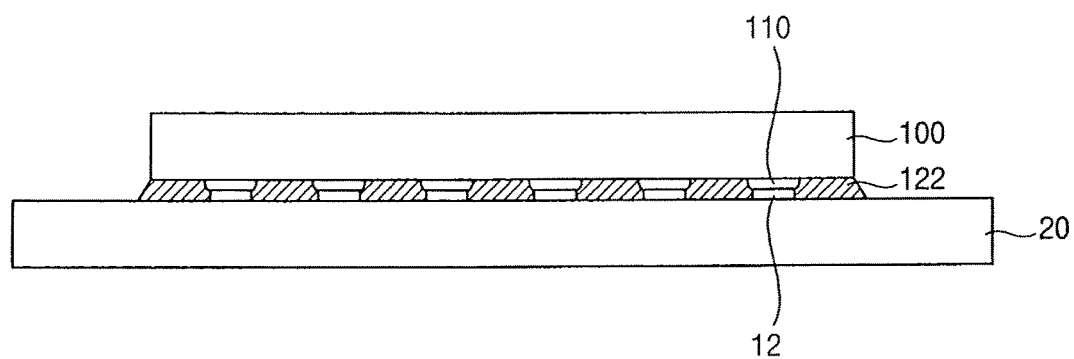
FIGS. 7A and 7B are cross-sectional views illustrating a display apparatus having an electronic device which is mounted thereon using a mounting method according to an exemplary embodiment of the present inventive concept.
Figure 7B:
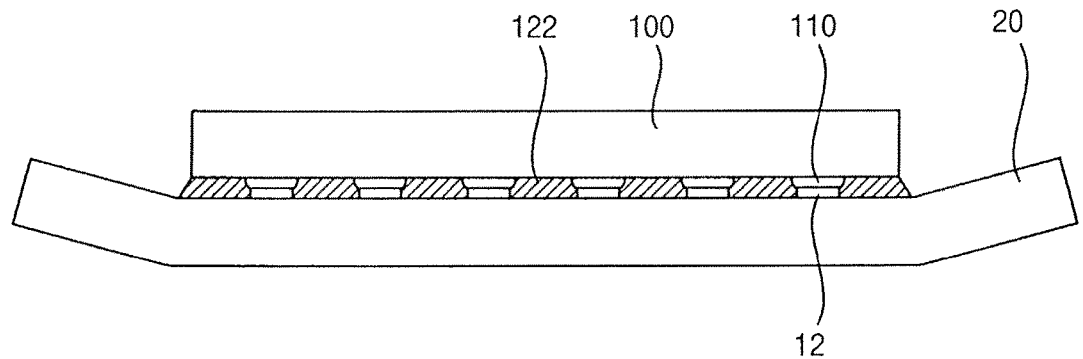

FIGS. 7A and 7B are cross-sectional views illustrating a display apparatus having an electronic device which is mounted thereon using a mounting method according to an exemplary embodiment of the present inventive concept.

Referring to FIGS. 7A and 7B, the electronic device may be mounted on a flexible substrate 20 which is used for a base substrate of the display apparatus. The flexible substrate 20 may be formed using a flexible material, so that the flexible substrate 20 is bendable.

An under-fill layer 122 may be formed between the electronic device and the flexible substrate 20. Thus, although the flexible substrate 20 is bent, a bump 110 of the electronic device might not be damaged, and a connection with a connecting pad 12 of the flexible substrate 20 may be maintained. Especially, for a curved display apparatus or a flexible display apparatus, the electronic device may be firmly mounted on the flexible substrate 20 despite any deformation or degree of curvature of the flexible substrate 20.

According to the present inventive concept, the electronic device, which has the under-fill element in the groove at the side surface of the semiconductor chip body, is used for the mounting method. Thus, work efficiency of the mounting method may be improved in comparison with a prior art which includes injecting under-fill resin or attaching under-fill film directly on the printed circuit board.

In addition, the under-fill element is already formed on the electronic device before mounting the electronic device. Thus, even though there may be limited space on the printed circuit board, the electronic device can be mounted on the printed circuit board, efficiently.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A mounting method of an electronic device, comprising:
providing an electronic device which comprises a semiconductor chip body including an upper surface, a lower surface opposite to the upper surface, and side surfaces connecting the upper surface and the lower surface, a plurality of bumps disposed on the lower surface, and an under-fill element disposed in at least one side surface;
mounting the electronic device on a printed circuit board including connecting pads formed thereon, wherein the bumps of the semiconductor chip body are connected to the connecting pads; and
heating the under-fill element to a predetermined temperature to form an under-fill layer between the lower surface of the semiconductor chip body and the printed circuit board.

2. The mounting method of claim 1, wherein, in the heating step,
the bumps are at least partially melted and connected to the connecting pads, and
the under-fill element is melted into the liquid phase and forms the under-fill layer.

3. A mounting method of an electronic device, comprising,
providing an electronic device which comprises a semiconductor chip body including an upper surface, a lower surface opposite to the upper surface, and side surfaces connecting the upper surface and the lower surface, a plurality of bumps disposed on the lower surface, and an under-fill element disposed in at least one side surface;
mounting the electronic device on a printed circuit board including connecting pads formed thereon, wherein the bumps of the semiconductor chip body are connected to the connecting pads; and
heating the under-fill element to a predetermined temperature to form an under-fill layer between the lower surface of the semiconductor chip body and the printed circuit board, wherein, in the heating step, the bumps are at least partially melted and connected to the connecting pads, and the under-fill element is melted into the liquid phase and forms the under-fill layer, wherein, in the providing the electronic device step, the under-fill element is formed by filling a groove formed on at least one side surface with an under-fill resin.

4. The mounting method of claim 1, wherein, in the providing the electronic device step,
the under-fill element is formed by attaching an under-fill film onto at least one side surface.

5. The mounting method of claim 4, wherein each side surface is substantially perpendicular to the lower and upper surfaces.

6. The mounting method of claim 1, wherein, in the providing the electronic device step,
the side surfaces comprise a first side surface, a second side surface opposite to the first side surface, a third side surface and a fourth side surface opposite to the third side surface, and
wherein the under-fill element is disposed on the first side surface and the third side surface.

7. The mounting method of claim 6, wherein the under-fill element is further disposed on the fourth side surface.

8. The mounting method of claim 1, wherein, in the providing the electronic device step,
the under-fill element is formed by filling a groove formed on at least one side surface with an under-fill resin.

9. The mounting method of claim 8, wherein each groove of the plurality of grooves extends along the side surface and towards the lower surface of the semiconductor chip body, so that the under-fill element formed in each groove of the plurality of grooves is exposed from the lower surface.

10. The mounting method of claim 9, wherein each groove of the plurality of grooves and the under-fill element have a semi-cylindrical shape or a triangular prism shape.

11. The mounting method of claim 10, wherein each groove of the plurality of grooves is disposed between two bumps adjacent to each other in a side surface view.

12. The mounting method of claim 3, wherein each groove of the plurality of grooves extends along the side surface and towards the lower surface of the semiconductor chip body, so that the under-fill element formed in each groove of the plurality of grooves is exposed from the lower surface.

13. The mounting method of claim 12, wherein each groove of the plurality of grooves and the under-fill element have a semi-cylindrical shape or a triangular prism shape.

14. The mounting method of claim 13, wherein each groove of the plurality of grooves is disposed between two bumps adjacent to each other in a side surface view.

* * * * *